(12) United States Patent
Chang et al.

(10) Patent No.: US 8,673,755 B2
(45) Date of Patent: Mar. 18, 2014

(54) SEMICONDUCTOR DEVICE HAVING METAL GATE AND MANUFACTURING METHOD THEREOF

(75) Inventors: Chu-Chun Chang, Tainan (TW);
Kuang-Hung Huang, Tainan (TW);
Chun-Mao Chiou, Chiayi County (TW);
Yi-Chung Sheng, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 28 days.

(21) Appl. No.: 13/282,475

(22) Filed: Oct. 27, 2011

(65) Prior Publication Data
US 2013/0105903 A1 May 2, 2013

(51) Int. Cl.
*H01L 27/092* (2006.01)
*H01L 21/28* (2006.01)

(52) U.S. Cl.
USPC .................. 438/535; 257/369; 257/E27.062; 257/E21.19

(58) Field of Classification Search
USPC .................. 257/369, 407, E27.064, E29.165, 257/E29.16
See application file for complete search history.

(56) References Cited

U.S. PATENT DOCUMENTS

| | | |
|---|---|---|
| 5,563,096 A | 10/1996 | Nasr |
| 5,847,421 A | 12/1998 | Yamaguchi |
| 5,950,090 A | 9/1999 | Chen |
| 6,171,436 B1 | 1/2001 | Huynh |
| 6,372,605 B1 | 4/2002 | Kuehne |
| 6,664,190 B2 | 12/2003 | Chen |
| 7,166,506 B2 | 1/2007 | Prince |
| 7,195,535 B1 | 3/2007 | Swedek |
| 7,196,010 B2 | 3/2007 | Park |
| 7,399,437 B2 | 7/2008 | James |
| 7,687,393 B2 | 3/2010 | Iwasa |
| 8,178,929 B2 * | 5/2012 | Nakanishi et al. ............ 257/369 |
| 2003/0166338 A1 | 9/2003 | Ahn |
| 2007/0108530 A1 * | 5/2007 | Ogawa et al. ................. 257/369 |
| 2008/0258271 A1 * | 10/2008 | Lee et al. ....................... 257/637 |
| 2009/0230479 A1 * | 9/2009 | Hsu et al. ....................... 257/369 |
| 2010/0112798 A1 * | 5/2010 | Lai et al. ....................... 438/591 |
| 2011/0014773 A1 | 1/2011 | Lin |

* cited by examiner

*Primary Examiner* — Matthew W Such
*Assistant Examiner* — Monica D Harrison
(74) *Attorney, Agent, or Firm* — Winston Hsu; Scott Margo

(57) ABSTRACT

A manufacturing method of a semiconductor device having metal gate includes providing a substrate having a first semiconductor device, a second semiconductor device, and a first insulating layer covering the first semiconductor device and the second semiconductor device formed thereon, performing an etching process to remove a portion of the first insulating layer to expose a portion of the first semiconductor device and the second semiconductor device, forming a second insulating layer covering the first semiconductor device and the second semiconductor device, performing a first planarization process to remove a portion of the second insulating layer, forming a first gate trench and a second gate trench respectively in the first semiconductor device and the second semiconductor device, and forming a first metal gate and a second metal gate respectively in the first gate trench and the second gate trench.

25 Claims, 6 Drawing Sheets

SEMICONDUCTOR DEVICE HAVING METAL GATE AND MANUFACTURING METHOD THEREOF

BACKGROUND OF THE INVENTION

1. Field of the Invention

The invention relates to a semiconductor device having metal gate and manufacturing method thereof, and more particularly, to a semiconductor device having metal gate and manufacturing method integrated with the gate last process.

2. Description of the Prior Art

With a trend toward scaling down the size of the semiconductor device, work function metals are used to replace the conventional polysilicon gate to be the control electrode that competent to the high dielectric constant (high-K) gate dielectric layer. The conventional dual metal gate methods are categorized into the gate first process and the gate last process. Among the two main processes, the gate last process is able to avoid processes of high thermal budget and to provide wider material choices for the high-K gate dielectric layer and the metal gate, and thus the gate last process gradually replaces the gate first process.

In the conventional gate last process, a dummy gate or a replacement gate is formed on a substrate and followed by steps of forming a conventional metal-oxide semiconductor (MOS) transistor device. Subsequently, the dummy/replacement gate is removed to form a gate trench. Then the gate trench is filled with work function metals required by different conductivity type. However, the gate last process still faces requirements to the process integration and to the material formation result. For example, when removing the unnecessary work function metal layer from the semiconductor device having the complementary conductivity type, and when removing overhangs that always formed at openings of the gate trenches, etching processes severely damages the dielectric material, particularly the inter layer dielectric (ILD) layer. Accordingly, a recess or a seam is formed in the ILD layer. More important, the following formed metal materials will fill up the recess or the seam in the ILD layer and those metals filling in the recess or the seam cannot be removed by the planarization process, thus cause remnant metal defect. It is found the remnant metal defect is more serious at the boundary between the work function metal layers having complementary conductivity types.

Accordingly, though the gate last process is able to avoid processes of high thermal budget and to provide more material choices for the high-K gate dielectric layer and the metal gate, the gate last process still faces integrity requirements for the complicated processes, reliability requirement for the layers filling in the gate trench, and needs solution for the remnant metal defects.

SUMMARY OF THE INVENTION

According to an aspect of the present invention, a manufacturing method of a semiconductor device having metal gate is provided. The manufacturing method includes providing a substrate having a first semiconductor device, a second semiconductor device, and a first insulating layer covering the first semiconductor device and the second semiconductor device formed thereon, the first semiconductor device and the second semiconductor device respectively having a dummy gate; performing an etching process to remove portions of the first insulating layer to expose a portion of the first semiconductor device and a portion of the second semiconductor device; forming a second insulating layer covering the first semiconductor device and the second semiconductor device on the substrate; performing a first planarization process to remove a portion of the second insulating layer to expose the dummy gates of the first semiconductor device and the second semiconductor device; removing the dummy gates to form a first gate trench in the first semiconductor device and a second gate trench in the second semiconductor device; and forming a first metal gate in the first gate trench and a second metal gate in the second metal gate.

According to another aspect of the present invention, a semiconductor device having metal gate is provided. The semiconductor device includes a substrate having a first semiconductor device and a second semiconductor device formed thereon, the first semiconductor device and the second semiconductor device respective having a first metal gate and second metal gate; an inter layer dielectric (ILD) layer formed at least between the first semiconductor device and the second semiconductor device; and a protecting layer formed on the protecting layer.

According to semiconductor device having metal gate and manufacturing method thereof provided by the present invention, the second insulating layer formed on the ILD layer serves as a protecting layer. Because the etching rate of the second insulating layer is different from that of the ILD layer, and the second insulating layer is a dense and strong layer, the second insulating layer protects the ILD layer during removing the unnecessary metal layer, particularly the ILD layer under the boundary between the work function metal layers having complementary work functions, and during removing the overhangs from the openings of the gate trenches. Consequently, the ILD layer is protected from the etching processes and the remnant metal defects occur at the ILD layer is therefore avoided.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-10 are schematic drawings illustrating a manufacturing method for a semiconductor device having metal gate provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

Figure 1:
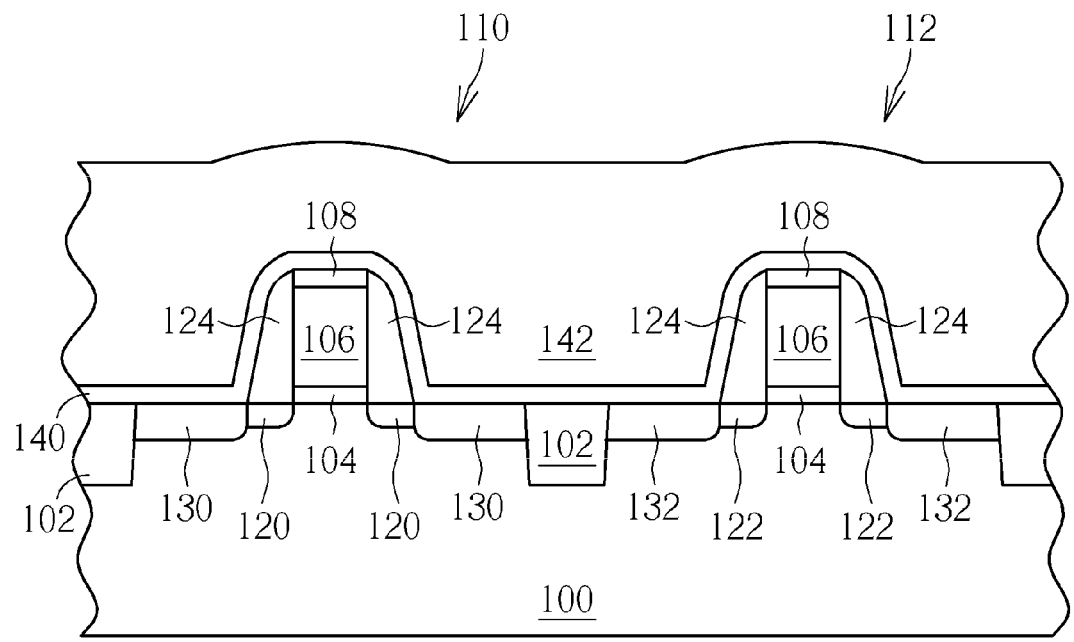

Please refer to FIGS. 1-5, which are drawings illustrating a manufacturing method for a semiconductor device having metal gate provided by a first preferred embodiment of the present invention. As shown in FIG. 1, the preferred embodiment first provides a substrate 100 such as silicon substrate, silicon-containing substrate, or silicon-on-insulator (SOI) substrate. The substrate 100 includes a first semiconductor device 110 and a second semiconductor device 112 formed thereon. A shallow trench isolation (STI) 102 is formed between the first semiconductor device 110 and the second semiconductor device 112 in the substrate 100 for providing electrical isolation. The first semiconductor device 110 includes a first conductivity type, the second semiconductor device 112 includes a second conductivity type, and the first conductivity type and the second conductivity type are complementary. In the preferred embodiment, the first conductivity type is p-type and the second conductivity type is n-type.

Please still refer to FIG. 1. The first semiconductor device 110 and the second semiconductor device 112 respectively includes a gate dielectric layer 104, a bottom barrier layer (not shown), a dummy gate 106 such as a polysilicon layer, and a patterned hard mask 108 for defining the dummy gates 106. The bottom barrier layer can include titanium nitride (TiN) and the patterned hard mask 108 can include silicon nitride (SiN), but not limited to this. Furthermore, the first semiconductor device 110 and the second semiconductor device 112 respectively include first lightly doped drains (LDDs) 120 and second LDDs 122, a spacer 124, a first source/drain 130 and a second source/drain 132. Additionally, salicides (not shown) are respectively formed on the first source/drain 130 and the second source/drain 132. After forming the first semiconductor device 110 and the second semiconductor device 112, a contact etch stop layer (CESL) 140 and a first insulating layer 142, such as an inter-layer dielectric (ILD) layer, are sequentially formed. As shown in FIG. 1, the first insulating layer 142 covers the first semiconductor device 110 and the second semiconductor device 112, entirely. Since the steps and material choices for the abovementioned elements are well-known to those skilled in the art, those details are omitted herein in the interest of brevity. Furthermore, selective strain scheme (SSS) can be used in the preferred embodiment. For example, a selective epitaxial growth (SEG) method can be used to form the first source/drain 130 and the second source/drain 132.

The gate dielectric layer 104 can be a conventional silicon oxide ($SiO_2$) layer, a high-K gate dielectric layer, or its combination. It is noteworthy that the preferred embodiment can be integrated with the high-k first process; therefore the gate dielectric layer 104 includes high-k materials such as rare earth metal oxide. The high-k gate dielectric layer 104 can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). Additionally, an interfacial layer (not shown) can be formed in between the high-k gate dielectric layer 104 and the substrate 100.

Figure 2:
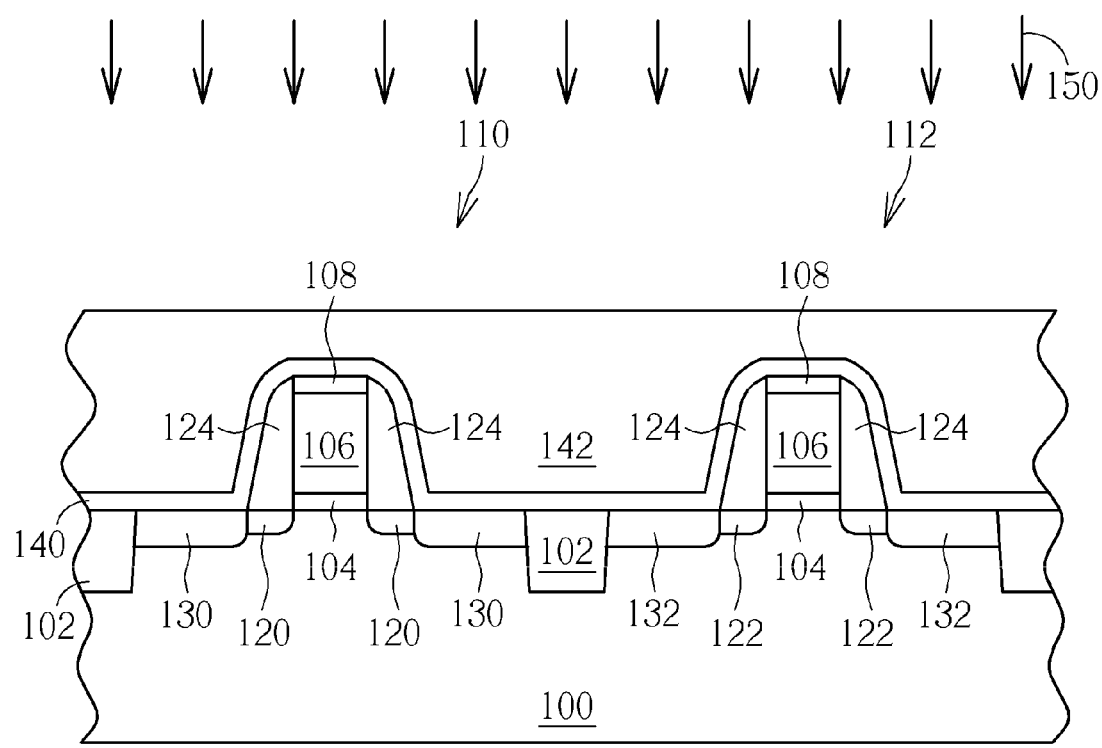

Please refer to FIG. 2. After forming the CESL 140 and the first insulating layer 142, a planarization process 150, such as a chemical mechanical polishing (CMP) process is performed to remove a portion of the first insulating layer 142. It is noteworthy that the first insulating layer 142 still entirely covers the first semiconductor device 110 and the second semiconductor device 112 even after the planarization process 150. In other words, the planarization process 150 is used to reduce a thickness of the first insulating layer 142. For example, the original thickness of the first insulating layer 142 is in a range of 300-500 angstroms (Å) before the planarization process 150, but the reduced thickness of the first insulating layer 142 is about 250 Å after the planarization process 150. Please note that the reduced thickness of the first insulating layer 142 is not limited to this; the reduced thickness of first insulating layer 142 can be even smaller as long as the first insulating layer 142 still covers the first semiconductor device 110 and the second semiconductor device 112 after the planarization process 150. Consequently, both of the first semiconductor device 110 and the second semiconductor device 112 are not exposed on the substrate 100 as shown in FIG. 2.

Figure 3:
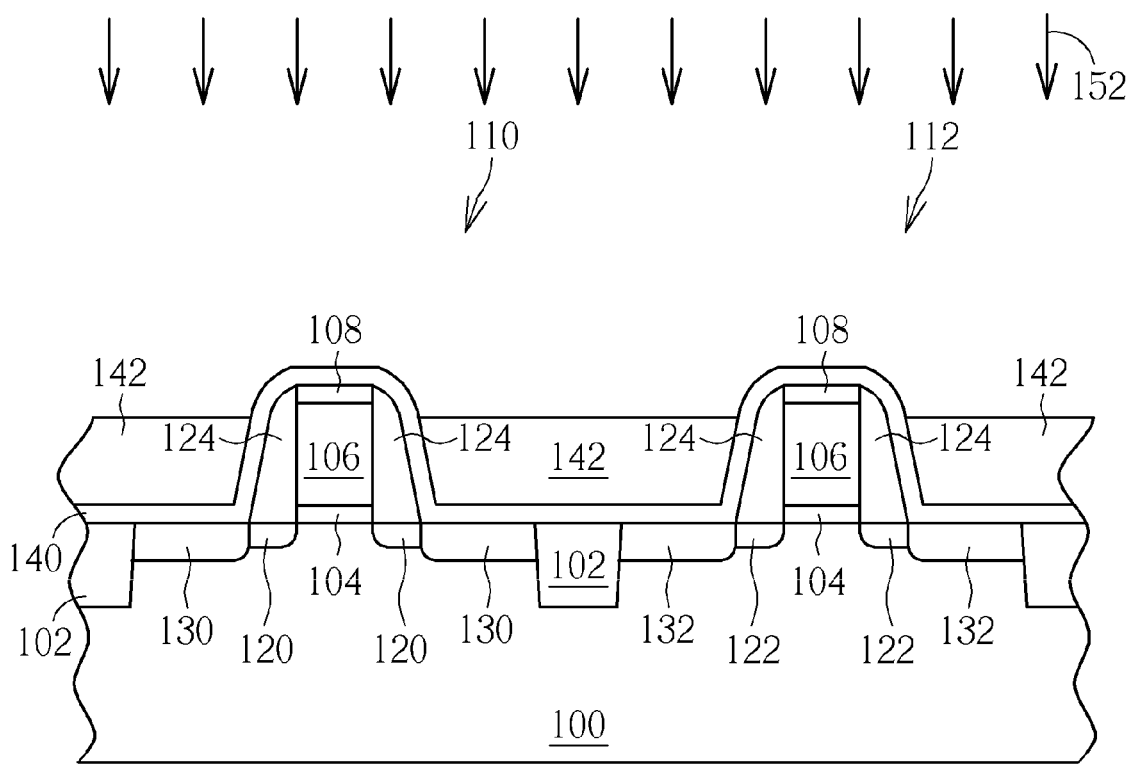

Please refer to FIG. 3. Subsequently, an etching process 152, such as a wet etching process utilizing diluted hydrofluoric acid (DHF), is performed to remove portions of the first insulating layer 142. Consequently, the first semiconductor device 110 and the second semiconductor device 112 are exposed. Because an etching rate of the first insulating layer 142 is different from etching rates of the CESL 140 and the patterned hard mask 108, the CESL 140 and the patterned hard mask 108 render protection to the first semiconductor device 110 and the second semiconductor device 112 in the etching process 152.

Figure 4:
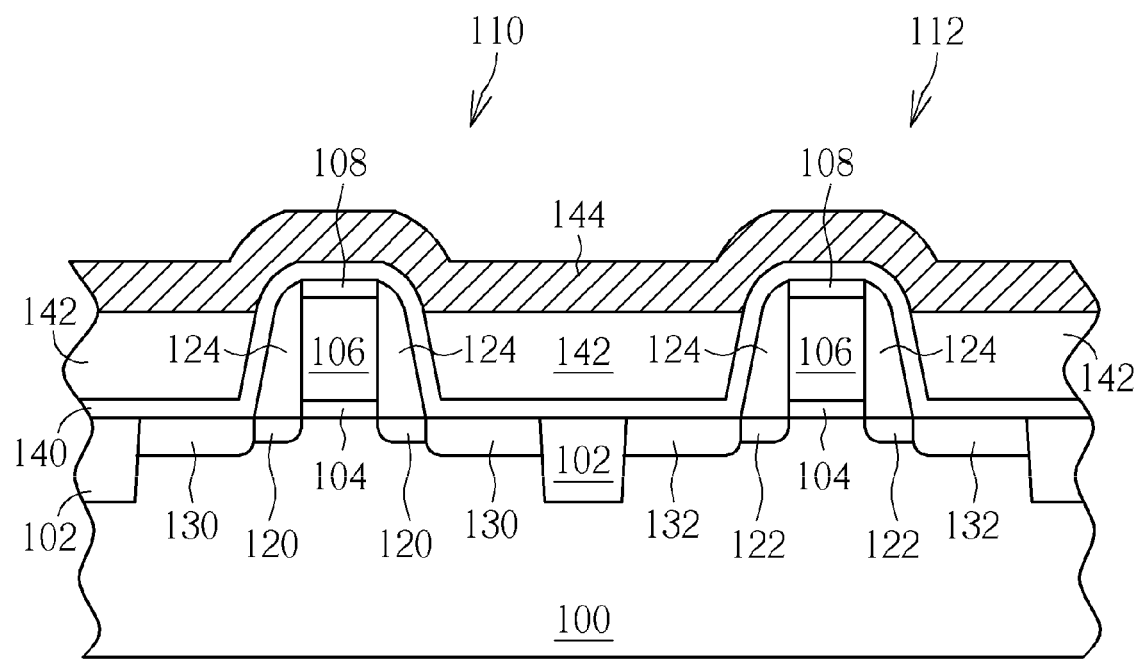

Please refer to FIG. 4. After the etching process 152, a second insulating layer 144 entirely covering the first semiconductor device 110 and the second semiconductor device 112 is formed on the substrate 100. It is noteworthy that an etching rate of the second insulating layer 144 is different from the etching rate of the first insulating layer 142. For example, when the first insulating layer 142 includes silicon oxide, the second insulating layer 144 includes silicon nitride. The second insulating layer 144 has a thickness, and the thickness is between 150 Å and 200 Å. Furthermore, the second insulating layer 144 is a conformal layer as shown in FIG. 4.

Figure 5:
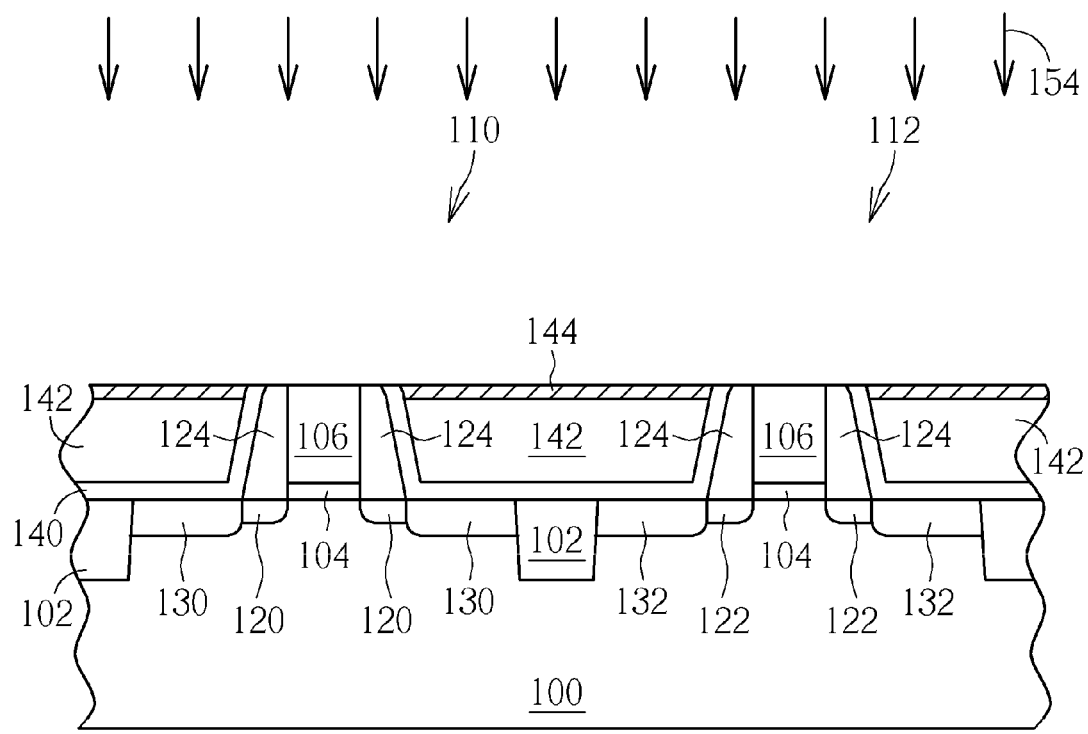

Please refer to FIG. 5. After forming the second insulating layer 144, another planarization process 154, such as a CMP process, is performed to remove portions of the second insulating layer 144 and thus to expose the dummy gates 106 of the first semiconductor device 110 and the second semiconductor device 112. It is noteworthy that since the planarization process 154 simultaneously removes the portions of the second insulating layer 144, portions of the CESL 140, and the patterned hard mask 108, the dummy gates 106 of the first semiconductor device 110 and the second semiconductor device 112 are exposed on the substrate 100 after the planarization process 154 as shown in FIG. 5.

Figure 6:
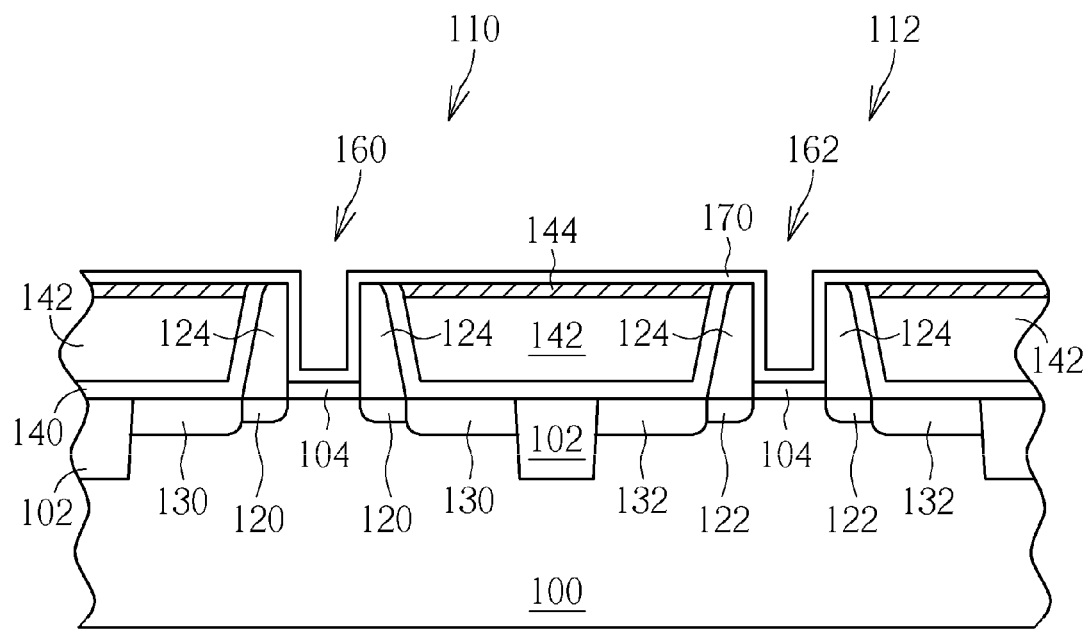

Please refer to FIG. 6. After the planarization process 154, a suitable etchant is used to remove the dummy gates 106 of the first semiconductor device 110 and the second semiconductor device 112. Consequently, a first gate trench 160 is formed in the first semiconductor device 110 and, simultaneously, a second gate trench 162 is formed in the second semiconductor device 112. Subsequently, an etch stop layer (now shown) is formed on the bottom barrier layer in both of the first gate trench 160 and the second gate trench 162. The etch stop layer can include tantalum nitride (TaN), but not limited to this.

It is also noteworthy that the manufacturing method provided by the present invention can be integrated with the high-k last process; therefore the gate dielectric layer includes a conventional $SiO_2$ layer. After removing the dummy gates 106 to form the first gate trench 160 and the second gate trench 162, the gate dielectric layer exposed in the bottoms of the first gate trench 160 and the second gate trench 162 serves as an interfacial layer (not shown). Next, a high-k gate dielectric layer 104 including materials as mentioned above is formed on the substrate 100 and followed by forming the etch stop layer.

Please still refer to FIG. 6. After forming the etch stop layer, a chemical vapor deposition (CVD) or a physical vapor deposition (PVD) is performed to form a first work function metal layer 170 in the first gate trench 160 and the second gate trench 162. The first work function metal layer 170 is a p-type work function metal layer and exemplarily includes TiN, TaN, titanium carbide (TiC), tantalum carbide (TaC), tungsten carbide (WC), or aluminum titanium nitride (TiAlN), but not limited to this. In addition, the first work function metal layer 170 can be a single-layered structure or a multi-layered structure.

Figure 7:
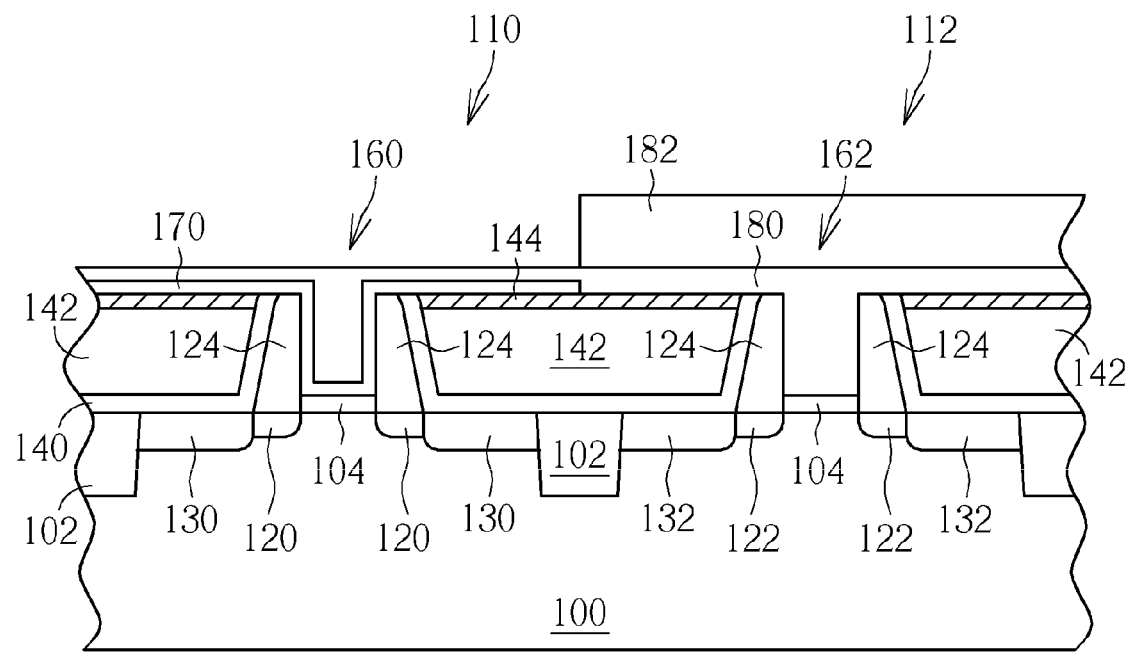

Please refer to FIG. 7. After forming the first work function metal layer 170, a patterned mask layer (not shown) covering the first semiconductor device 110 but exposing the first work function metal layer 170 in the second semiconductor device 112 is formed on the substrate 100. Next, a suitable etchant is used to remove the first work function metal layer 170 not covered by the patterned mask layer. During removing the first work function metal layer 170 from the second gate trench 162, the loose ILD material (the first insulating layer 142) on the substrate 100 is protected not only by the etch stop layer (not shown), but also by the dense and strong second insulating layer 144.

Figure 8:
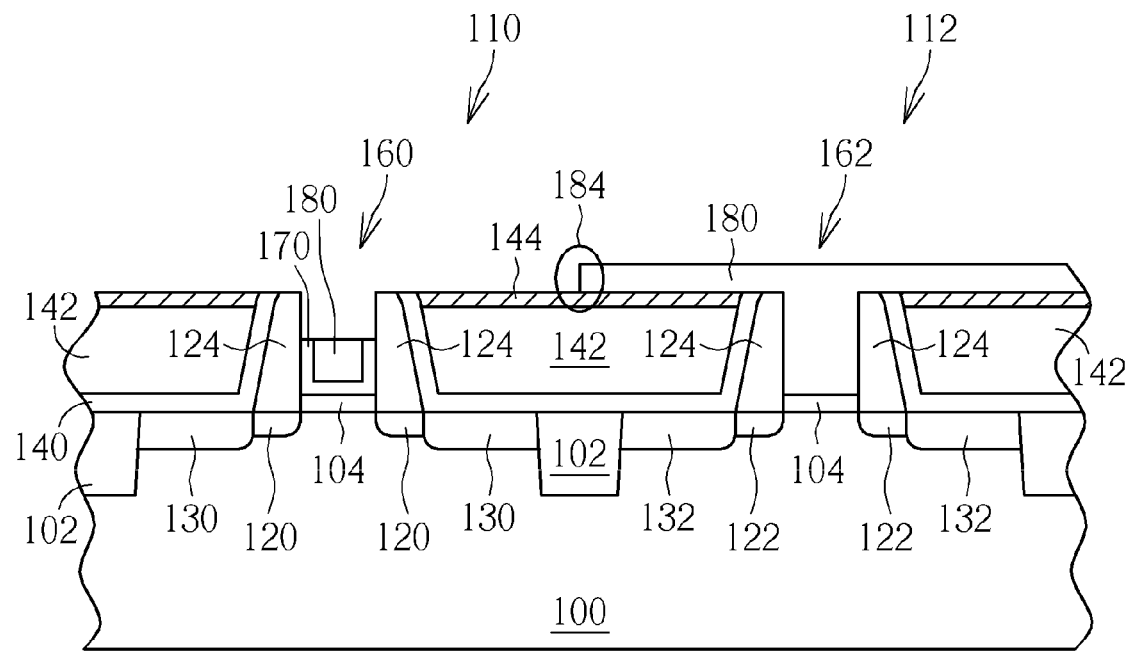

Please still refer to FIG. 7 and FIG. 8. For improving the gap-filling result of the following formed metal layer, a sacrificial layer 180 filling up the first gate trench 160 and the second gate trench 162 is formed on the substrate 100. Then, a patterned photoresist 182 exposing the sacrificial layer 180 in the first semiconductor device 160 is formed and followed by performing an etching back process. Accordingly, the sacrificial layer 180 in the first gate trench 160 is etched back and thus a surface of the sacrificial layer 180 is lower than an opening of the first gate trench 160. Subsequently, another etching process is performed to remove a portion of the first work function metal layer 170 from the first gate trench 160. Consequently, the first work function metal layer 170 remains only in the first gate trench 160, particularly on the bottom and sidewalls of the first gate trench 160. In other words, a height of the first work function metal layer 170 is smaller than a depth of the first gate trench 160. Thus gap-filling result of the following formed metal layer is improved. It should be noted that because materials under the boundary (as emphasized by Circle 184) between the first semiconductor device 110 and the second semiconductor device 112 undergoes many etching processes, it is found that the etch stop layer (not shown) is insufficient to protect its underneath materials from the abovementioned etching processes. As a countermeasure against to the problem, the preferred embodiment provides the dense and strong second insulating layer 144 to protect the loose ILD layer 142. Therefore ILD layer 142 under the boundary 184 between the first semiconductor device 110 and the second semiconductor device 112 is protected and seams used to be formed in the ILD layer 142 are avoided. And the remnant metal filling the seams in the ILD layer 142 is consequently prevented.

Figure 9:
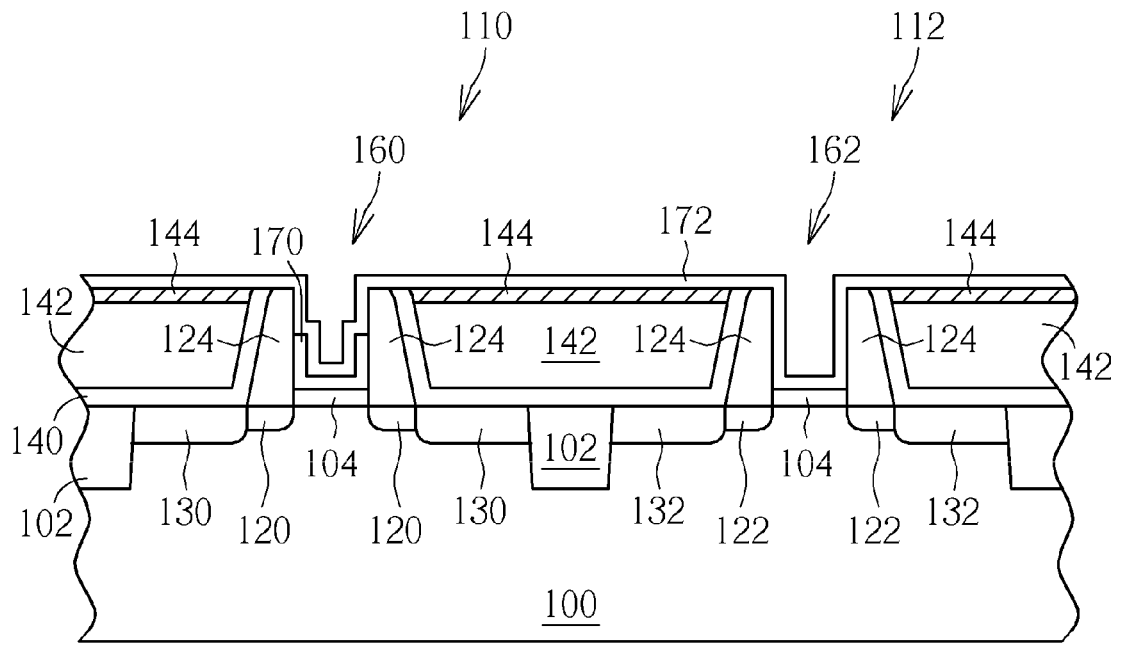

Please refer to FIG. 9. After removing the portion of the first work function metal layer 170 from the first gate trench 160 and removing the sacrificial layer 180, a CVD process or a PVD process is performed to form a second work function metal layer 172 on the substrate 100. The second work function metal layer 172 includes an n-type work function metal layer such as titanium aluminide (TiAl), zirconium aluminide (ZrAl), tungsten aluminide (WAl), tantalum aluminide (TaAl), or hafnium aluminide (HfAl), but not limited to this. Additionally, the second work function metal layer 172 can be a single-layered structure or a multi-layered structure.

Figure 10:
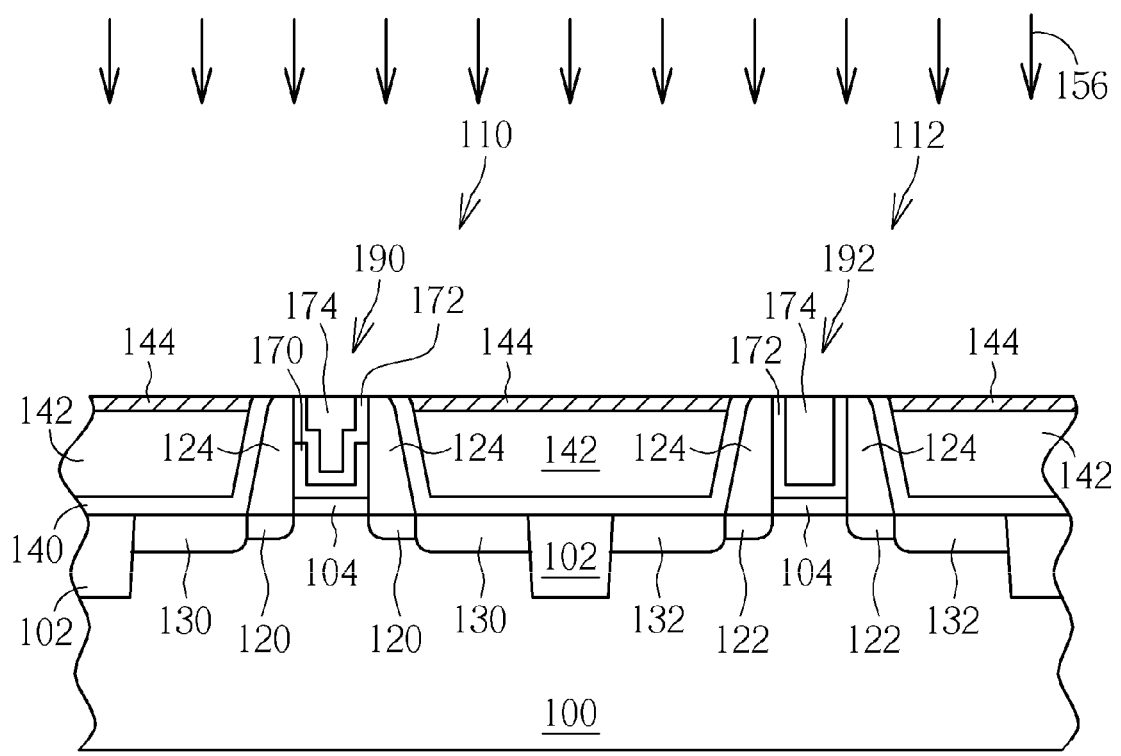

Please refer to FIG. 10. Next, a filling metal layer 174 is formed in both of the first gate trench 160 and the second gate trench 162. Additionally, a top barrier layer (not shown) is preferably formed between the second work function metal layer 172 and the filling metal layer 174. The top barrier layer can include TiN, but not limited to this. The filling metal layer 174 is formed to fill up the first gate trench 160 and the second gate trench 162. The filling metal layer 174 includes materials with low resistance and superior gap-filling characteristic, such as Al, TiAl, or titanium aluminum oxide (TiAlO), but not limited to this. Subsequently, a planarization process 156, such as a CMP process, is performed to remove the unnecessary filling metal layer 174 and second work function metal layer 172. Consequently, a first metal gate 190 and a second metal gate 192 are obtained respectively in the first gate trench 160 and the second gate trench 162. As shown in FIG. 10, the first metal gate 190, the second metal gate 192, and the second insulating layer 144 are coplanar. It is noteworthy that during the planarization process 156, the second insulating layer 144 serves as a protecting layer for its underneath ILD layer 142. Accordingly, the loose ILD layer 142 is protected from the planarization process 156 when removing the unnecessary filling metal layer 174 and second work function metal layer 172, and thus dishing defect is prevented.

Additionally, the ILD layer 142 is formed between the CESL 140 and the second insulating layer 144. More important, the CESL 140 contacts the second insulating layer 144 and thus the ILD layer 142 is encompassing by the CESL 140 and the second insulating layer 144.

According to semiconductor device having metal gate and manufacturing method thereof provided by the first preferred embodiment, the dense and strong second insulating layer 144 formed on the loose ILD layer 142 serves as a protecting layer, therefore the ILD layer 142 is protected during removing the unnecessary metal layer and removing the overhangs from the openings of the gate trenches. Consequently, seams and remnant metal left in the seams are all avoided. Furthermore, the second insulating layer 144 protects the ILD 142 during the planarization process, therefore the dishing defects that used to found in the loose ILD layer is also avoided.

Figure 11:
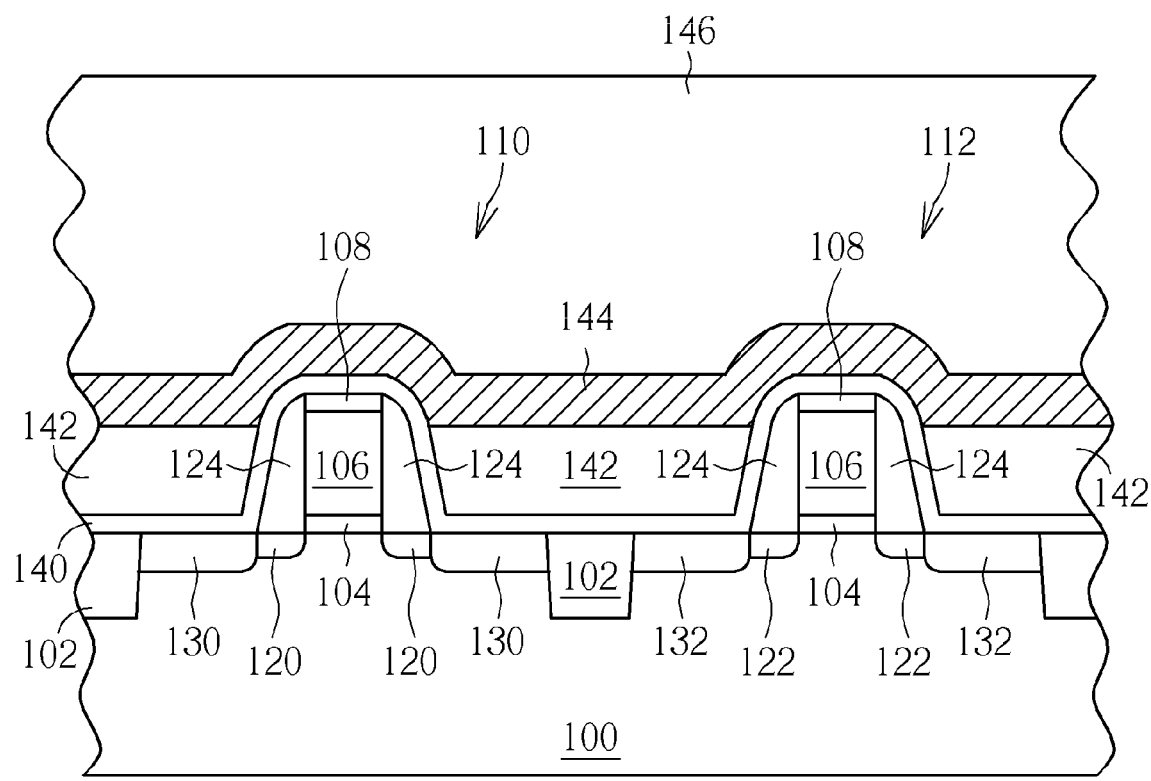
FIG. 11 is a drawing illustrating a manufacturing method for a semiconductor device having metal gate provided by a second preferred embodiment of the present invention.

Please refer to FIG. 11, which is a drawing illustrating a manufacturing method for a semiconductor device having metal gate provided by a second preferred embodiment of the present invention. It should be noted that elements the same in both the first and second preferred embodiments are designated by the same numerals and the material choices and forming steps for those elements are all omitted in the interest of brevity. The difference between the second preferred embodiment and the first preferred embodiment is: After forming the second insulating layer 144, a third insulating layer 146 is directly formed on the second insulating layer 144. An etching rate of the third insulating layer 146 is different from the etching rate of the second insulating layer 144. For instance, when the second insulating layer 144 includes silicon nitride, the third insulating layer 146 includes undoped silicate glass (USG), but not limited to this. The third insulating layer 146 includes a thickness, and the thickness is larger than 2000 Å. It is noteworthy that the second insulating layer 144 is a conformal layer, therefore the second insulating layer 144 includes a rugged topography inherited from the ILD layer 142, the first semiconductor device 110 and the second semiconductor device 112. Different from the conformal second insulating layer 144, the thick third insulating layer 146 includes a substantial even surface on the substrate 100 as shown in FIG. 11. Subsequently, the planarization process 154 is performed as mentioned above. It is also noteworthy that the third insulating layer 146 is completely removed by the planarization process 154 and thus the second preferred embodiment has the same structure as shown in FIG. 5 after the planarization process 154. Then, steps illustrated in FIGS. 6-10 are sequentially performed to form the semiconductor device having metal gate. Since the third insulating layer 146 includes the even surface on the substrate 100, the even third insulating layer 146 is advantageous to the planarization process 154.

According to semiconductor device having metal gate and manufacturing method thereof provided by the present invention, the second insulating layer formed on the ILD layer serves as a protecting layer. Because the etching rate of the second insulating layer is different from that of the ILD layer, and the second insulating layer is a dense and strong layer, the second insulating layer protects the ILD layer during removing the unnecessary metal layer, particularly the ILD layer under the boundary between the work function metal layers having complementary work functions, and during removing the overhangs from the openings of the gate trenches. Consequently, the ILD layer is protected from the etching processes and the remnant metal defects occur at the ILD layer is therefore avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device having metal gate, comprising:
   providing a substrate having a first semiconductor device, a second semiconductor device, a contact etch stop layer (CESL) covering the first semiconductor device and the second semiconductor device, formed thereon, and a first insulating layer covering the CESL, the first semiconductor device and the second semiconductor device respectively having a dummy gate;
   performing an etching process to remove portions of the first insulating layer to expose a portion of the CESL, a portion of the first semiconductor device and a portion of the second semiconductor device;
   forming a second insulating layer covering the first semiconductor device and the second semiconductor device on the substrate;
   performing a first planarization process to remove a portion of the CESL and a portion of the second insulating layer to expose the dummy gates of the first semiconductor device and the second semiconductor device;
   removing the dummy gates to form a first gate trench in the first semiconductor device and a second gate trench in the second semiconductor device; and
   forming a first metal gate in the first gate trench and a second metal gate in the second metal gate.

2. The manufacturing method of a semiconductor device having metal gate according to claim 1, further comprising performing a second planarization process to remove a portion of the first insulating layer before the etching process.

3. The manufacturing method of a semiconductor device having metal gate according to claim 2, wherein the first insulating layer covers the first semiconductor device and the second semiconductor device after the second planarization process.

4. The manufacturing method of a semiconductor device having metal gate according to claim 1, wherein an etching rate of the second insulating layer is different from an etching rate of the first insulating layer.

5. The manufacturing method of a semiconductor device having metal gate according to claim 4, wherein the first insulating layer comprises silicon oxide and the second insulating layer comprises silicon nitride.

6. The manufacturing method of a semiconductor device having metal gate according to claim 1, wherein the second insulating layer comprises a thickness and the thickness is between 150 angstroms (Å) and 200 angstroms.

7. The manufacturing method of a semiconductor device having metal gate according to claim 1, wherein the first semiconductor device and the second semiconductor device respectively comprise a patterned hard mask.

8. The manufacturing method of a semiconductor device having metal gate according to claim 7, wherein the first planarization process removes the patterned hard mask.

9. The manufacturing method of a semiconductor device having metal gate according to claim 1, further comprising forming a third insulating layer on the second insulating layer, and an etching rate of the third insulating layer is different from an etching rate of the second insulating layer.

10. The manufacturing method of a semiconductor device having metal gate according to claim 9, wherein the third insulating layer comprises an even surface on the substrate.

11. The manufacturing method of a semiconductor device having metal gate according to claim 9, wherein the third insulating layer comprises a thickness and the thickness is larger than 2000 angstroms.

12. The manufacturing method of a semiconductor device having metal gate according to claim 9, wherein the first planarization process removes the third insulating layer completely.

13. The manufacturing method of a semiconductor device having metal gate according to claim 1, wherein the step of forming the first metal gate in the first gate trench and the second metal gate in the second gate trench further comprising:
   forming a first work function metal layer in the first gate trench and the second gate trench;
   removing the first work function metal layer from the second gate trench;
   forming a second work function metal layer in the first gate trench and the second gate trench;
   forming a filling metal layer in the first gate trench and the second gate trench; and
   performing a third planarization process to remove a portion of the filling metal layer and the second work function metal layer to form the first metal gate and the second metal gate.

14. A manufacturing method of a semiconductor device having metal gate, comprising:
   providing a substrate having a first semiconductor device, a second semiconductor device, and a first insulating layer covering the first semiconductor device and the second semiconductor device formed thereon, the first semiconductor device and the second semiconductor device respectively having a dummy gate;

performing a first planarization process to remove a portion of the first insulating layer;

performing an etching process to remove portions of the first insulating layer to expose a portion of the first semiconductor device and a portion of the second semiconductor device after the first planarization process;

forming a second insulating layer covering the first semiconductor device and the second semiconductor device on the substrate;

performing a second planarization process to remove a portion of the second insulating layer to expose the dummy gates of the first semiconductor device and the second semiconductor device;

removing the dummy gates to form a first gate trench in the first semiconductor device and a second gate trench in the second semiconductor device; and forming a first metal gate in the first gate trench and a second metal gate in the second metal gate.

15. The manufacturing method of a semiconductor device having metal gate according to claim 14, wherein the first insulating layer covers the first semiconductor device and the second semiconductor device after the first planarization process.

16. The manufacturing method of a semiconductor device having metal gate according to claim 14, wherein an etching rate of the second insulating layer is different from an etching rate of the first insulating layer, and the first insulating layer comprises silicon oxide and the second insulating layer comprises silicon nitride.

17. The manufacturing method of a semiconductor device having metal gate according to claim 14, wherein the first semiconductor device and the second semiconductor device respectively comprise a patterned hard mask, and the second planarization process removes the patterned hard mask.

18. The manufacturing method of a semiconductor device having metal gate according to claim 14, wherein the step of forming the first metal gate in the first gate trench and the second metal gate in the second gate trench further comprising:

forming a first work function metal layer in the first gate trench and the second gate trench;

removing the first work function metal layer from the second gate trench;

forming a second work function metal layer in the first gate trench and the second gate trench;

forming a filling metal layer in the first gate trench and the second gate trench; and performing a third planarization process to remove a portion of the filling metal layer and the second work function metal layer to form the first metal gate and the second metal gate.

19. A manufacturing method of a semiconductor device having metal gate, comprising:

providing a substrate having a first semiconductor device, a second semiconductor device, and a first insulating layer covering the first semiconductor device and the second semiconductor device formed thereon, the first semiconductor device and the second semiconductor device respectively having a dummy gate;

performing an etching process to remove portions of the first insulating layer to expose a portion of the first semiconductor device and a portion of the second semiconductor device;

forming a second insulating layer covering the first semiconductor device and the second semiconductor device on the substrate;

forming a third insulating layer on the second insulating layer, and an etching rate of the third insulating layer being different from an etching rate of the second insulating layer;

performing a first planarization process to remove a portion of the second insulating layer to expose the dummy gates of the first semiconductor device and the second semiconductor device;

removing the dummy gates to form a first gate trench in the first semiconductor device and a second gate trench in the second semiconductor device;

forming a first metal gate in the first gate trench and a second metal gate in the second metal gate.

20. The manufacturing method of a semiconductor device having metal gate according to claim 19, wherein the third insulating layer comprises an even surface on the substrate.

21. The manufacturing method of a semiconductor device having metal gate according to claim 19, wherein the third insulating layer comprises a thickness and the thickness is larger than 2000 Å.

22. The manufacturing method of a semiconductor device having metal gate according to claim 19, wherein the first planarization process removes the third insulating layer completely.

23. The manufacturing method of a semiconductor device having metal gate according to claim 19, wherein an etching rate of the second insulating layer is different from an etching rate of the first insulating layer, and the first insulating layer comprises silicon oxide and the second insulating layer comprises silicon nitride.

24. The manufacturing method of a semiconductor device having metal gate according to claim 19, wherein the first semiconductor device and the second semiconductor device respectively comprise a patterned hard mask, and the first planarization process removes the patterned hard mask.

25. The manufacturing method of a semiconductor device having metal gate according to claim 19, wherein the step of forming the first metal gate in the first gate trench and the second metal gate in the second gate trench further comprising:

forming a first work function metal layer in the first gate trench and the second gate trench;

removing the first work function metal layer from the second gate trench;

forming a second work function metal layer in the first gate trench and the second gate trench;

forming a filling metal layer in the first gate trench and the second gate trench; and performing a third planarization process to remove a portion of the filling metal layer and the second work function metal layer to form the first metal gate and the second metal gate.

* * * * *